United States Patent
Zhou et al.

(10) Patent No.: US 7,866,375 B2
(45) Date of Patent: Jan. 11, 2011

(54) HEAT DISSIPATION DEVICE WITH HEAT PIPES

(75) Inventors: Shi-Wen Zhou, Shenzhen (CN); Chun-Chi Chen, Taipei Hsien (TW); Bao-Chun Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 1075 days.

(21) Appl. No.: 11/566,003

(22) Filed: Dec. 1, 2006

(65) Prior Publication Data

US 2008/0128111 A1 Jun. 5, 2008

(51) Int. Cl.
*F28D 15/00* (2006.01)
*F28F 7/00* (2006.01)
*H01L 23/24* (2006.01)
*H05K 7/20* (2006.01)

(52) U.S. Cl. ............ 165/104.33; 165/80.4; 165/104.26; 361/700; 361/704; 257/715; 174/15.2

(58) Field of Classification Search ............ 165/104.33, 165/104.26, 80.3, 80.4; 361/700, 704; 257/715; 174/15.2
See application file for complete search history.

(56) References Cited

U.S. PATENT DOCUMENTS

| | | | | |
|---|---|---|---|---|
| 6,967,845 B2 * | 11/2005 | Chiang et al. | ............... | 361/709 |
| 7,025,125 B2 * | 4/2006 | Sheng et al. | ............ | 165/104.33 |
| 7,385,825 B2 * | 6/2008 | Xia et al. | ..................... | 361/719 |
| 7,426,956 B2 | 9/2008 | Lin et al. | | |
| 7,451,806 B2 * | 11/2008 | Zhou et al. | ............. | 165/104.33 |
| 7,520,316 B2 * | 4/2009 | Xia et al. | ............... | 165/104.33 |
| 7,760,501 B2 * | 7/2010 | Zha et al. | ..................... | 361/697 |
| 2003/0019610 A1 | 1/2003 | Liu | | |
| 2005/0056404 A1 * | 3/2005 | Lee et al. | ............... | 165/104.33 |
| 2005/0099774 A1 * | 5/2005 | Song | .......................... | 361/700 |
| 2006/0082972 A1 * | 4/2006 | Kim | .......................... | 361/709 |
| 2006/0144572 A1 * | 7/2006 | Yu et al. | ................. | 165/104.33 |
| 2006/0291166 A1 * | 12/2006 | Cheng | ........................ | 361/700 |
| 2007/0000646 A1 * | 1/2007 | Chen et al. | ............. | 165/104.33 |
| 2007/0044944 A1 * | 3/2007 | Lin | ....................... | 165/104.33 |

(Continued)

FOREIGN PATENT DOCUMENTS

CN 2664180 Y 12/2004

(Continued)

*Primary Examiner*—Frantz F Jules
*Assistant Examiner*—Brandon M Rosati
(74) *Attorney, Agent, or Firm*—Jeffrey T. Knapp

(57) ABSTRACT

A heat dissipation device includes a base (10), a plurality of fins (20), first and second heat pipes (30), (40), a fan holder (50) and a fan (60) secured to the fan holder. The first heat pipe includes a heat-receiving section (32) and two heat-discharging sections (34). The second heat pipe includes an evaporating portion (42) and two condensing portions (44). The condensing portions of the second heat pipe extend into the fins and are disposed adjacent to opposite ends of each of the fins. One heat-discharging section extends in the fins and is disposed between the condensing portions, thus allowing heat absorbed from the base to be evenly distributed throughout the fins by the heat-discharging sections and the condensing portions.

17 Claims, 4 Drawing Sheets

U.S. PATENT DOCUMENTS

2007/0131390 A1 * 6/2007 Chen et al. ............. 165/104.33
2007/0151711 A1 * 7/2007 Chen et al. ............. 165/104.33
2007/0261822 A1 * 11/2007 Lin et al. ................ 165/104.33

FOREIGN PATENT DOCUMENTS

| CN | 1870251 A | 11/2006 |
| TW | M248212 | 10/2004 |
| TW | M269699 | 7/2005 |
| TW | M275395 | 9/2005 |

* cited by examiner

HEAT DISSIPATION DEVICE WITH HEAT PIPES

BACKGROUND OF THE INVENTION

1. Field of the Invention

The present invention relates to a heat dissipation device for removing heat from an electronic device, and more particularly to a heat dissipation device incorporating heat pipes for improving heat dissipation capacity thereof.

2. Description of Related Art

As computer technology continues to advance, electronic components such as central processing units (CPUs) of computers are being made to provide faster operational speeds and greater functional capabilities. When a CPU operates at a high speed in a computer enclosure, its temperature is greatly increased. It is desirable to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer.

A conventional heat dissipation device comprises a heat sink and a pair of heat pipes. The heat sink comprises a base and a plurality of fins extending from the base. The base has a bottom surface attached to an electronic component and defines two grooves in a top surface opposite the bottom surface. Each heat pipe has a heat-receiving portion accommodated in one of the grooves and a pair of heat-discharging portions extending from opposite free ends of the heat-receiving portion and inserted into the top fins. The base absorbs heat produced by the electronic component and transfers the heat directly to the fins through the heat pipes. By the provision of the heat pipes, heat dissipation efficiency of the heat dissipation device is improved.

However, due to structural limitations, the contact area between the heat pipes and the fins is limited, which results in that the heat removal efficiency by the conventional heat dissipation device still cannot meet the increasing heat removal requirements of the modern heat-generating electronic devices.

SUMMARY OF THE INVENTION

A heat dissipation device in accordance with a preferred embodiment of the present invention includes a base, a plurality of fins attached to the base, first and second heat pipes, a fan and a fan holder securing the fan to a side of all of the fins. The first heat pipe includes a bent heat-receiving section received in the base and two heat-discharging sections extending into the fins. The second heat pipe includes an evaporating portion received in the base and two condensing portions extending into the fins. The evaporating portion is enclosed by the heat-receiving section. One heat-discharging section of the first heat pipe is disposed between the condensing portions of the second heat pipe to distribute heat absorbed from the base throughout the fins.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
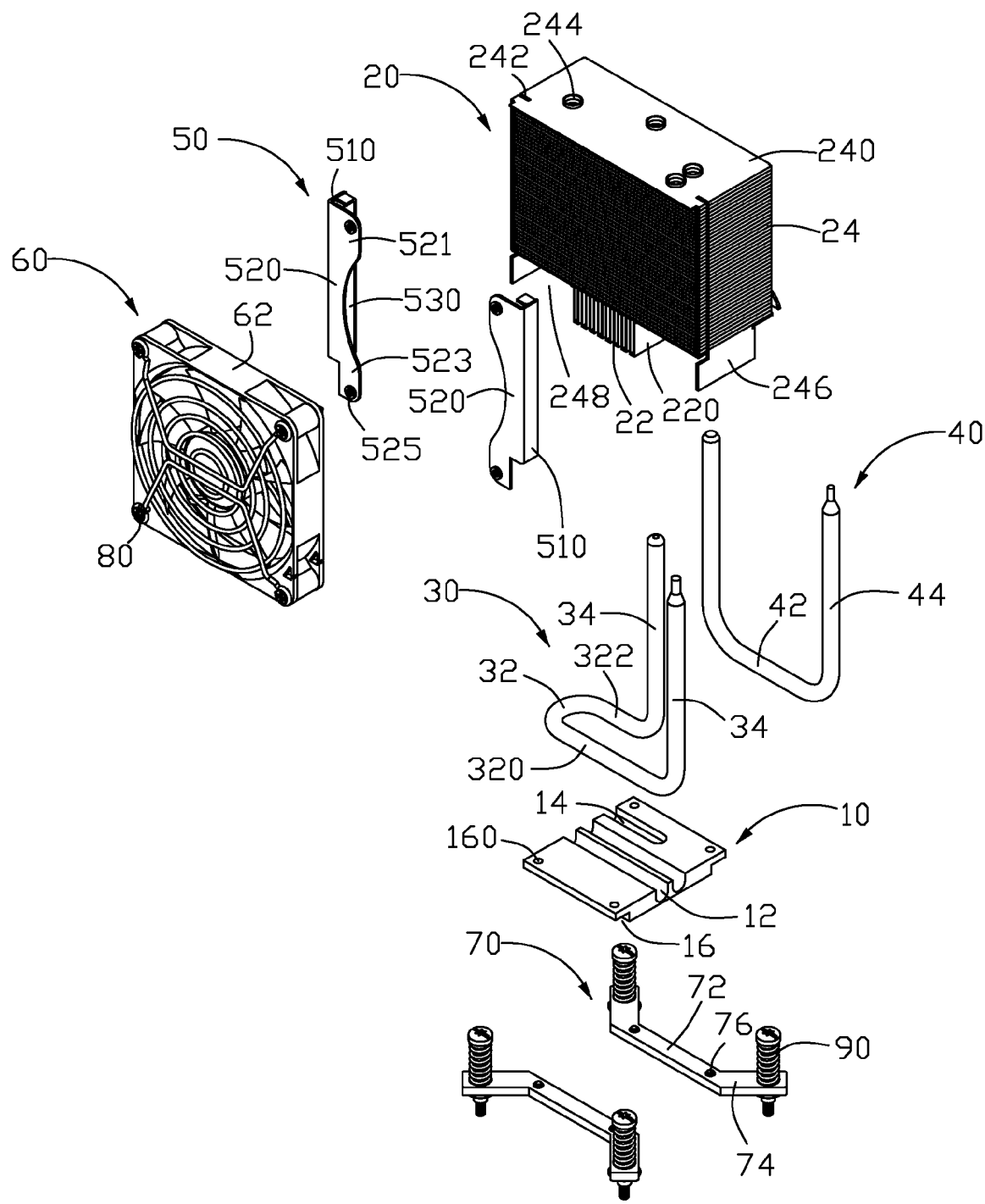
FIG. 1 is an exploded, isometric view of a heat dissipation device according to a preferred embodiment of the present invention.
Figure 2:
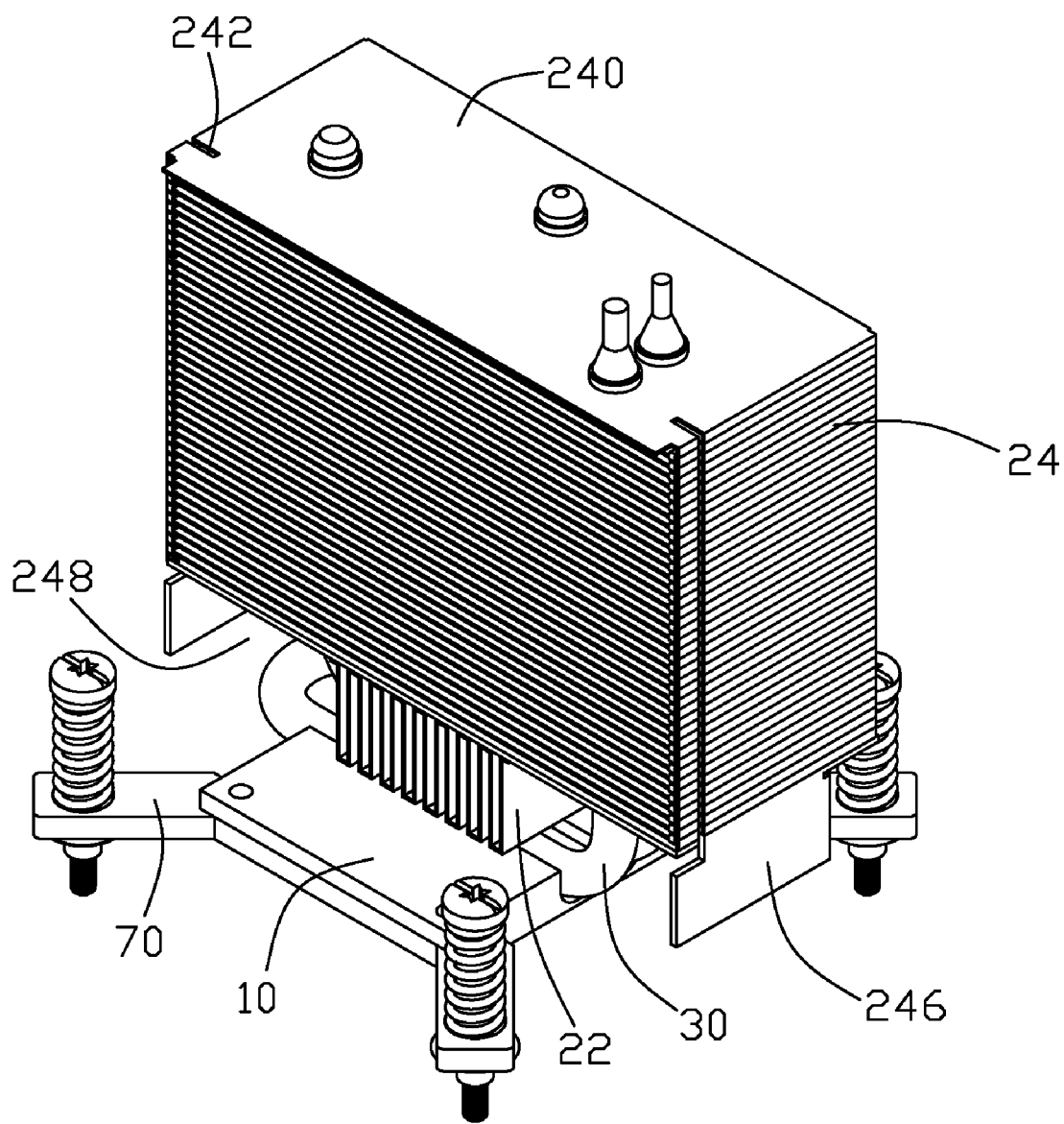
FIG. 2 is a partially assembled view of FIG. 1.

Referring to FIG. 1, a heat dissipation device with heat pipes in accordance with a preferred embodiment of the present invention, which is used for dissipating heat from an electronic component (not shown), such as an integrated circuit package (not shown) is illustrated. The heat dissipation device comprises a base 10, a heat-dissipation portion 20, first and second heat pipes 30, 40, a fan holder 50 and a fan 60. The heat dissipation device further comprises two locking members 70 engaging with the base 10 to secure the heat dissipation device to the printed circuit board.

The base 10 is substantially square, and can be made of a thermally conductive material such as copper or aluminum. The base 10 has a flat bottom surface (not labeled) for attaching to the electronic component and a flat top surface (not labeled) opposite the flat bottom surface. The base 10 defines two parallel grooves 12 and a slot 14 in sequence in the top surface thereof, for receiving the first and second heat pipes 30, 40. The two grooves 12 are separated by a narrow gap, and located at a center of the base 10. The slot 14 is shorter than each groove 12 and located at a side of the base 10. The base 10 further defines two undercuts (not labeled) in opposite sides of the bottom surface thereof to form two locking portions 16 for fastening with the locking members 70. The undercuts are parallel to the grooves 12. Each locking portion 16 defines two locking holes 160 therein.

The heat-dissipation portion 20 comprises a first fin group 22 attached to the base 10 and a second fin group 24 attached to the first fin group 22. The first fin group 22 comprises a plurality of vertical folded fins 220 perpendicular to the base 10. The first fin group 22 is attached to the top surface of the base 10 and a bottom surface of the second fin group 24. A plurality of channels (not labeled) are defined between two adjacent vertical fins 220 and from a front end to a rear end of the first fin group 22. The first fin group 22 is disposed at a middle portion of a bottom of the second fin group 24. The second fin group 24 comprises a plurality of horizontal fins 240 parallel to the base 10. The fins 240 are horizontally stacked on top of each other to form a horizontal fin group. Each fin 240 forms a pair of flanges (not labeled) perpendicularly extending from two opposite lateral sides thereof, respectively. A plurality of channels (not labeled) are defined between two adjacent horizontal fins 240 and from a front end to a rear end of the second fin group 24. Two slits 242 are defined in the two opposite lateral sides of the second fin group 24 and located adjacent a front face thereof. Four through holes 244 are defined vertically through the horizontal fins 240. Two through holes 244 are disposed together opposite the others in opposite sides of the fin 240. A bottom-most fin 240 of the second fin group 24 has a pair of baffle-plates 246 perpendicularly extending from opposite sides thereof and the baffle-plates 246 cooperate with the first fin group 22 and the base 10 to define a pair of passageways 248 at the bottom of the second fin group 24 for allowing forced airflow produced by the fan 60 to pass through.

The first heat pipe 30 has a double L-shaped configuration and comprises a substantially n-shaped heat-receiving section 32 and a pair of heat-discharging sections 34 perpendicularly extending from opposite free ends of the heat-receiving section 32. The heat-receiving section 32 further comprises a first heat-receiving part 320 and a second heat-receiving part 322 shorter than the first heat-receiving part 320 so that the heat-discharging sections 34 are separated by a long distance from each other. The heat-discharging sections 34 are oriented parallel to each other and each perpendicular to a plane defined by the heat-receiving section 32. The heat-receiving section 32 is received in a corresponding groove 12 and the slot 14 of the base 10 by soldering. The heat-discharging sections 34 are extended in corresponding two of the through holes 244 and thermally contact with the fins 240.

The second heat pipe 40 is a U-shaped configuration and comprises an evaporating portion 42 and a pair of condensing portions 44 extending from opposite free ends of the evaporating portion 42. The evaporating portion 42 is received in the corresponding groove 12 of the base 10 by soldering and is enclosed by the heat-receiving section 32 of the first heat pipe 30. The condensing portions 44 are extended in corresponding other two of the through holes 244 and thermally contact with the fins 240. The condensing portions 44 of the second heat pipe 40 are disposed near the two opposite lateral sides of the second fin group 24, and one of the heat-discharging sections 34 of the first heat pipe 30 is disposed between the condensing portions 44 of the second heat pipe 40.

The fan holder 50 comprises a pair of brackets (not labeled) attached to two lateral sides of a front face of the heat-dissipation portion 20. Each bracket comprises a main body 510. A substantially C-shaped fixing faceplate 520 and a positioning rib 530 perpendicularly extends from opposing lateral edges of the main body 510, respectively. The faceplate 520 comprises a tab 521 and an ear 523 at upper and lower parts thereof, respectively. An indentation (not labeled) is defined between the tab 521 and the ear 523. A thread aperture 525 is defined in each of the tab 521 and the ear 523. The fan 60 comprises a rectangular frame 62. The frame 62 defines four orifices (not shown) in four corners corresponding to the thread apertures 525 of the faceplates 520 of the brackets. Screws 80 are used to extend through the orifices of the fan 60 and screwed into the thread aperture 525 to thereby secure the fan 60 to the fan holder 50. Airflow generated by the fan 60 flows through the channels (not labeled) in the heat-dissipation portion 20 to take heat away therefrom.

Figure 3:
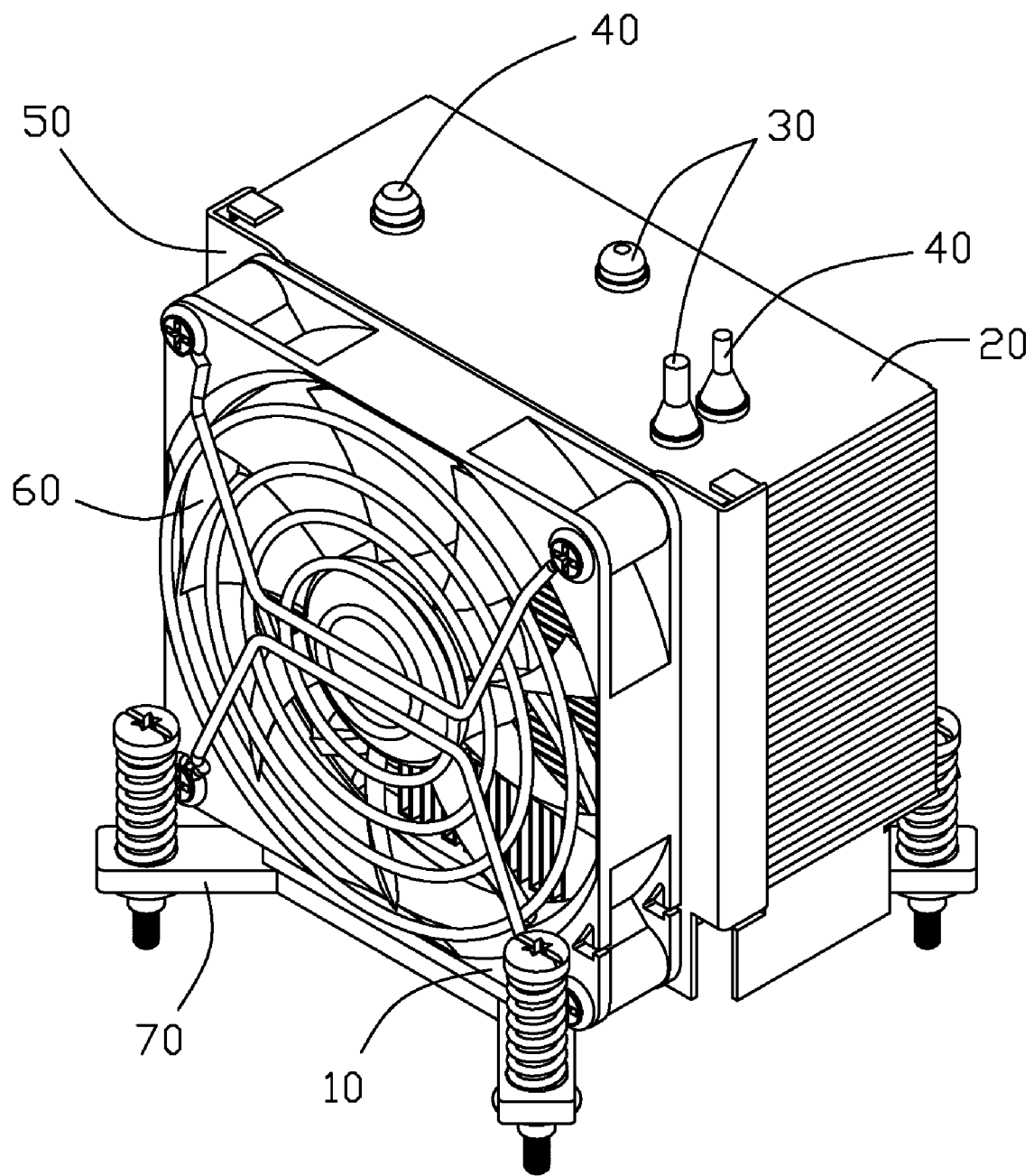
FIG. 3 is an assembled view of FIG. 1.

Referring to FIG. 3, in assembly the fan holder 50 to the front face of the heat-dissipation portion 20. The ribs 530 of the fan holder 50 are inserted in corresponding slits 242 of the heat-dissipation portion 20. The faceplates 520 of the fan holder 50 are located on the front face of the heat-dissipation portion 20. In this way the two brackets are fixed to the heat-dissipation portion 20 with the two faceplates 520 thereof extending toward each other.

Each locking member 70 comprises a locking lever 72 engaging with the corresponding locking portion 16 of the base 10 and two legs 74 extending outwardly from opposite ends of the locking lever 72 and angled with the locking lever 72. The locking lever 72 defines bores 76 therein. Screws or rivets (not shown) are used to extend through the locking holes 160 in the base 10 and engage in the bores 76 to secure the locking members 70 to the base 10. The legs 74 define apertures (not shown) therein for extending screws 90 therethrough to engage in corresponding fixtures (not shown) on the printed circuit board to thereby mount the heat dissipation device to the printed circuit board.

In the present invention, the heat-receiving section 32 of the first heat pipe 30 and the evaporating portion 42 of the second heat pipe 40 are soldered in the grooves 12 and the slot 14 in the base 10 so that the heat-receiving section 32 and the evaporating portion 42 are each thermally connected with the base 10. A bottom of the first fin group 22 is soldered to the top surface of the base 10 so that the first fin group 22 is thermally connected with the base 10. The heat-discharging sections 34 of the first heat pipe 30 and the condensing portions 44 of the second heat pipe 40 are soldered in the through holes 244 of the heat-dissipation portion 20 so that the heat-discharging sections 34 and the condensing portions 44 thermally contact with the fins 240.

Figure 4:
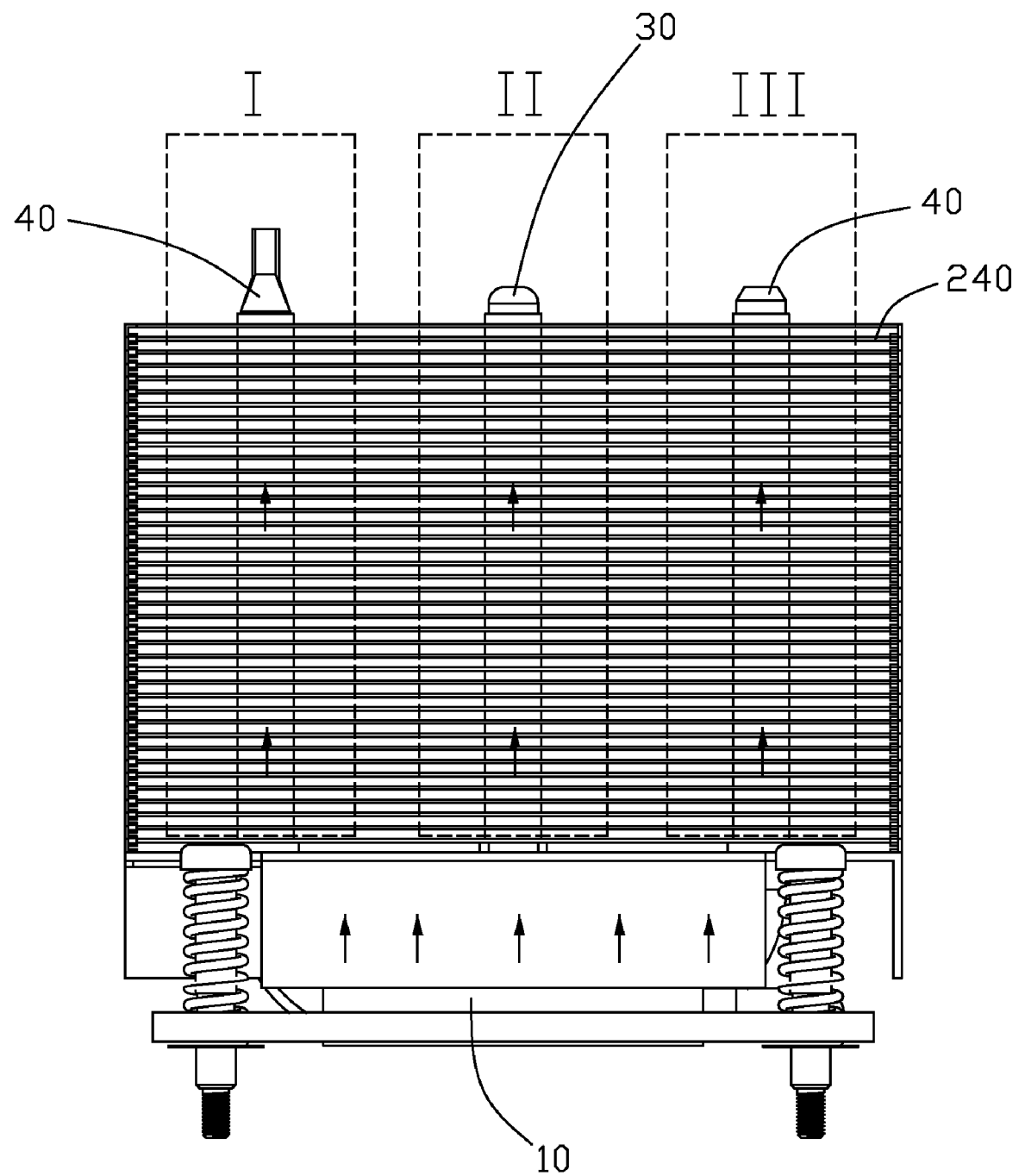
FIG. 4 is a side view of FIG. 3, showing heat transfer paths of the heat dissipation device.

Referring to FIG. 4, heat-transferring paths of the heat dissipation device are shown and three heat-dissipation regions are formed in a vertical direction of all of the fins 240.

In operation, referring to FIGS. 1 and 4, the base 10 absorbs heat from the electronic component (not shown) and a major part of the heat is directly transferred to the heat-receiving section 32 of the first heat pipe 30 and the evaporating portion 42 of the second heat pipe 40. A minor part of the heat is conducted upwardly to the fins 240 via the vertical folded fins 220. The major part of the heat received by the heat-receiving section 32 of the first heat pipe 30 is transmitted to the fins 240 in contact with the heat-discharging sections 34 of the first heat pipe 30, thus allowing the heat to be dissipated in first and second heat-dissipation regions of the fins 240 by the two heat-discharging sections 34 of the first heat pipe 30. The major part of the heat received by the evaporating portion 42 of the second heat pipe 40 is transmitted to the fins 240 in contact with the condensing portions 44 of the second heat pipe 40, whereby the heat is dissipated in the first and a third heat-dissipation regions of the fins 240. The heat from the base 10 is upwardly transferred to the fins 240 along the paths and distributed in the three heat-dissipation regions, whereby the heat is significantly distributed throughout each of the fins 240.

In the present invention, the use of the double L-shaped heat pipe 30 and U-shaped heat pipe 40 allows contacting areas between the heat pipes 30, 40 and the fins 240 to be significantly increased, and therefore heat transferred by the heat pipes 30, 40 can be more efficiently taken away.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a base attached to an electronic component;
a plurality of fins attached to the base;
a first heat pipe comprising a bent heat-receiving section received in the base and a pair of heat-discharging sections extending from free ends of the heat-receiving section and extending in the fins; and
a second heat pipe comprising an evaporating portion and a pair of condensing portions extending from opposite free ends of the evaporating portion and extending in the fins;
wherein the condensing portions of the second heat pipe are disposed near two ends of all the fins and one heat-discharging section of the first heat pipe is disposed between the condensing portions of the second heat pipe; and wherein the evaporating portion of the second heat pipe is received in the base and enclosed by the heat-receiving section of the first heat pipe.

2. The heat dissipation device as claimed in claim 1, wherein the base defines two grooves and a slot in sequence, and the heat-receiving section of the first heat pipe is arranged in a corresponding groove and the slot and the evaporating portion of the second heat pipe is arranged in another corresponding groove.

3. The heat dissipation device as claimed in claim 2, wherein the two grooves are disposed in a center of the base, and the slot is arranged in a side of the base.

4. The heat dissipation device as claimed in claim 1, wherein the other heat-discharging section of the first heat pipe is disposed adjacent one of the condensing portions of the second heat pipe.

5. The heat dissipation device as claimed in claim 1, wherein the heat-receiving section of the first heat pipe is n-shaped and each heat-discharging section is perpendicular to a plane defined by the heat-receiving section.

6. The heat dissipation device as claimed in claim 5, wherein the heat-receiving section of the first heat pipe comprises a first heat-receiving part and a second heat-receiving part shorter than the first heat-receiving part, the evaporating portion of the second heat pipe being disposed between the first and second heat-receiving parts.

7. The heat dissipation device as claimed in claim 1, wherein the fins comprise a plurality of vertical fins attached on the base and a plurality of parallel fins attached on the vertical fins.

8. The heat dissipation device as claimed in claim 1, wherein all of the fins define two slits in two opposite lateral sides thereof, and the heat dissipation device further comprises a fan holder attached to the fins by engagement in the slits.

9. The heat dissipation device as claimed in claim 8, wherein the fan holder comprises a main body and a positioning rib perpendicularly extending from a lateral edge of the main body for inserting in a corresponding slit.

10. A heat dissipation device adapted for cooling an electronic component, comprising:
a base adapted for contacting the electronic component;
a plurality of fins having a lower portion soldered to the base;
a first heat pipe having a bent heat-receiving section soldered to the base and two heat-discharging sections extending from two free ends of the bent heat-receiving section and extending in the fins;
a second heat pipe having an evaporating portion soldered to the base and two condensing portions extending from two free ends of the evaporating portion and thermally contacting the fins wherein the condensing portions of the second heat pipe are disposed near two ends of all the fins and one heat-discharging section of the first heat pipe is disposed between the condensing portions of the second heat pipe; and wherein the evaporating portion of the second heat pipe is received in the base and enclosed by the heat-receiving section of the first heat pipe;
a fan; and
a fan holder holding the fan thereon and inserting into the fins to secure the fan to the fins;
wherein the heat-receiving section of the first heat pipe is arranged at opposite sides of the evaporating portion of the second heat pipe.

11. The heat dissipation device as claimed in claim 10, wherein the bent heat-receiving section is n-shaped and each heat-discharging section is perpendicular to a plane defined by the bent heat-receiving section.

12. The heat dissipation device as claimed in claim 10, wherein the fins comprise a plurality of vertical fins attached on the base and a plurality of parallel fins attached on the vertical fins.

13. The heat dissipation device as claimed in claim 10, further comprising two locking members engaging with the base adapted to secure the heat dissipation device to a printed circuit board.

14. A heat dissipation device comprising:
a base for contacting a heat-generating electronic component;
a plurality of horizontal fins mounted above the base;
a first heat pipe having a heat-receiving section embedded in the base, and two heat-discharging sections extending upwardly from two ends of the heat-receiving section and vertically through the horizontal fins, the heat-receiving section comprising first and second parts; and
a second heat pipe having an evaporator section embedded in the base and located between the first and second parts of the heat-receiving section of the first heat pipe, and two condenser sections extending upwardly from two ends of the evaporator section and vertically through the horizontal fins;
wherein one of the heat-discharging sections of the first heat pipe is located between the two condenser sections of the second heat pipe, and the other one of the heat-discharging sections of the first heat pipe is located adjacent to a corresponding one of the two condenser sections of the second heat pipe.

15. The heat dissipation device as claimed in claim 14, wherein the heat-receiving section of the first heat pipe has a substantially n-shaped configuration, and the second heat pipe has a substantially U-shaped configuration.

16. The heat dissipation device as claimed in claim 14, further comprising a plurality of vertical folded fins between the base and the horizontal fins.

17. The heat dissipation device as claimed in claim 14, wherein the first and second parts of the heat-receiving section of the first heat pipe have different lengths.

* * * * *